US012650472B2

(12) United States Patent　　　　　(10) Patent No.:　US 12,650,472 B2

Ha　　　　　　　　　　　　　　　　　(45) Date of Patent:　　　Jun. 9, 2026

(54) BATTERY CELL MONITORING METHOD AND APPARATUS

(71) Applicant: SAMSUNG SDI CO., LTD., Yongin-si (KR)

(72) Inventor: Sangmin Ha, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 155 days.

(21) Appl. No.: 18/408,829

(22) Filed: Jan. 10, 2024

(65) Prior Publication Data

US 2025/0138097 A1　　May 1, 2025

(30) Foreign Application Priority Data

Oct. 30, 2023　(KR) ......................... 10-2023-0146345

(51) Int. Cl.
　　*G01R 31/52*　　　(2020.01)
　　*G01R 31/3835*　　(2019.01)
　　*G01R 31/396*　　(2019.01)

(52) U.S. Cl.
　　CPC ....... *G01R 31/3835* (2019.01); *G01R 31/396* (2019.01); *G01R 31/52* (2020.01)

(58) Field of Classification Search
　　CPC .. G01R 31/3835; G01R 31/396; G01R 31/52; G01R 31/382; G01R 31/392; G01R 31/367; G01R 31/385–388
　　See application file for complete search history.

(56) References Cited

U.S. PATENT DOCUMENTS

| | | | |
|---|---|---|---|
| 8,587,256 B2 * | 11/2013 | Tae ........................ | H02J 7/0029 320/132 |
| 2009/0099799 A1 * | 4/2009 | Barsoukov ........... | G01R 31/382 702/63 |
| 2013/0110428 A1 | 5/2013 | Sun et al. | |
| 2020/0072912 A1 | 3/2020 | Chun et al. | |

(Continued)

FOREIGN PATENT DOCUMENTS

| | | |
|---|---|---|
| CN | 111077452 A | 4/2020 |
| EP | 3933422 A1 | 1/2022 |

(Continued)

OTHER PUBLICATIONS

Extended European Search Report dated Oct. 23, 2024, for corresponding European Patent Application No. 24164253.7.

(Continued)

*Primary Examiner* — Lee E Rodak
*Assistant Examiner* — Demetrius R Pretlow
(74) *Attorney, Agent, or Firm* — Lee IP Law, P.C.

(57) ABSTRACT

A cell monitoring method may include measuring an open-circuit voltage (OCV) of each of the battery cells in a first idle period, estimating a capacity of each of the battery cells using the OCV of each of the battery cells measured in the first idle period, measuring an OCV of each of the battery cells in a second idle period following the first idle period, estimating a capacity of each of the battery cells using the OCV of each of the battery cells measured in the second idle period, and detecting an internal short-circuit cell based on the capacity of each of the battery cells in the first idle period and the capacity of each of the battery cells in the second idle period. Also disclosed is a cell monitoring apparatus.

9 Claims, 7 Drawing Sheets

(56)        References Cited

U.S. PATENT DOCUMENTS

| 2021/0135298 | A1 | 5/2021 | Akaishi et al. |
| 2021/0318386 | A1 | 10/2021 | Itakura et al. |
| 2023/0333170 | A1 | 10/2023 | Kim et al. |
| 2024/0044999 | A1 | 2/2024 | Park et al. |

FOREIGN PATENT DOCUMENTS

| JP | 2017-223537 | A | 12/2017 |
| JP | 2023-008149 | A | 1/2023 |
| JP | 7226249 | B2 | 2/2023 |
| JP | 2023-050339 | A | 4/2023 |
| JP | 2023-538052 | A | 9/2023 |
| JP | 2023-543779 | A | 10/2023 |
| KR | 10-2022-0040190 | A | 3/2022 |

OTHER PUBLICATIONS

Japanese Office Action dated Jul. 1, 2025, in corresponding Japanese Patent Application No. 2024-69121.

* cited by examiner

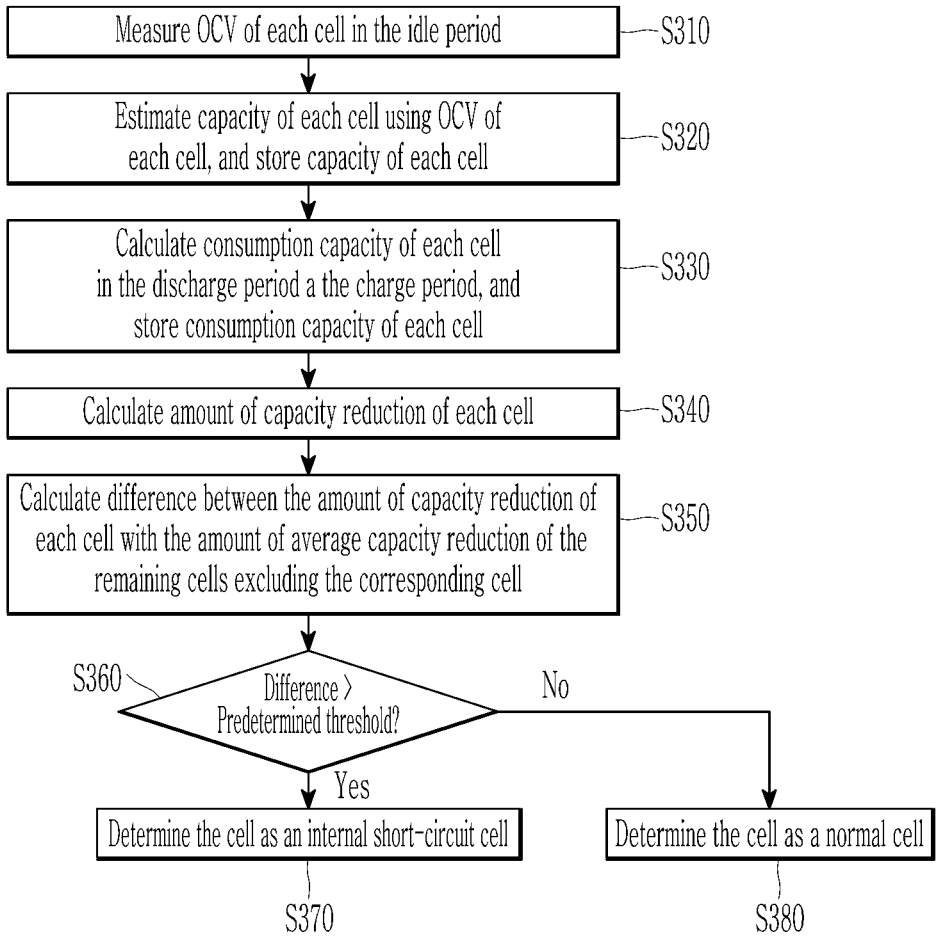

Measure OCV of each cell in the idle period —S310

Estimate capacity of each cell using OCV of each cell, and store capacity of each cell —S320

Calculate consumption capacity of each cell in the discharge period a the charge period, and store consumption capacity of each cell —S330

Calculate amount of capacity reduction of each cell —S340

Calculate difference between the amount of capacity reduction of each cell with the amount of average capacity reduction of the remaining cells excluding the corresponding cell —S350

S360 — Difference 〉 Predetermined threshold? — No

Yes

Determine the cell as an internal short-circuit cell

S370

Determine the cell as a normal cell

BATTERY CELL MONITORING METHOD AND APPARATUS

CROSS-REFERENCE TO RELATED APPLICATION

This application claims priority to and the benefit of Korean Patent Application No. 10-2023-0146345 filed in the Korean Intellectual Property Office on Oct. 30, 2023, the entire contents of which are incorporated herein by reference.

BACKGROUND

1. Field

This disclosure relates to a battery cell monitoring method and apparatus.

2. Description of the Related Art

Because an energy storage system (ESS) includes battery cells, if a specific cell ignites due to an internal short, it may spread to adjacent cells, and as a result, there is a high possibility that the entire system will burn down. Therefore, it is very important to detect an internal short-circuit in the cell early, so that the user can stop operation of the system and respond safely before the cell ignites.

If an internal short occurs in a cell, the capacity of the cell continues to decrease, and an internal short may usually be determined by estimating an amount of cell capacity reduction. However, in order to estimate the cell capacity reduction, the charge/discharge capacity of the cell must be accurately calculated, and accurate calculation of the charge/discharge capacity of the cell may be difficult due to various factors such as the accuracy of the current sensor, efficiency by temperature and charge/discharge rate, current consumption of the battery management system, self-discharge amount of the cell and cell balancing.

SUMMARY

Embodiments include a method for monitoring battery cells in a battery module in a cell monitoring apparatus. The method includes measuring an open-circuit voltage (OCV) of each of the battery cells during a first idle period, estimating a capacity of each of the plurality of cells using the OCV of each of the plurality of cells measured during the first idle period, measuring an OCV of each of the battery cells during a second idle period following the first idle period, estimating a capacity of each of the battery cells using the OCV of each of the battery cells measured during the second idle period, and detecting an internal short-circuit cell based on the capacity of each of the battery cells during the first idle period and the capacity of each of the battery cells during the second idle period.

Detecting an internal short-circuit cell may include calculating an amount of capacity reduction of each of the battery cells based on a difference between the capacity of each of the battery cells during the first idle period and the capacity of each of the battery cells during the second idle period, and determining whether a first cell among the battery cells is the internal short-circuit cell by comparing amount of capacity reduction of the first cell with an amount of average capacity reduction of remaining cells excluding the first cell among the battery cells.

Determining whether the first cell is the internal short-circuit cell may include determining the first cell as the internal short-circuit cell if a difference between the amount of capacity reduction of the first cell and the amount of average capacity reduction of the remaining cells excluding the first cell is greater than a predetermined threshold.

The method may further include calculating a consumption capacity of each of the battery cells during a discharge period and a charge period, wherein calculating an amount of capacity reduction of each of the battery cells may include calculating the amount of capacity reduction of each of the battery cells reflecting the consumption capacity of each of the battery cells calculated during the discharge period and the charge period in the difference between capacities of each of the battery cells estimated during the first idle period and the second idle period.

Calculating the consumption capacity of each of the battery cells may include connecting the battery module to a load during the discharging period and connecting the battery module to a charging device during the charging period.

Measuring an OCV of each of the battery cells may include blocking current supply to the battery module.

Embodiments include a battery cell monitoring apparatus that manages battery cells by setting a rest period, a discharge period and a charge period as one operation cycle, the battery cell monitoring apparatus including an open-circuit voltage (OCV) calculator that measures the OCV of each of the battery cells during an idle period of each operation cycle and estimates a capacity of each of the battery cells using the OCV of each of the battery cells, a consumption capacity calculator that calculates a consumption capacity of each of the battery cells during the discharge period and the charge period of each operation cycle, and a short-circuit cell detector that calculates an amount of capacity reduction of each of the battery cells based on the capacity of each of the battery cells and a consumption capacity of each of the battery cells, and detects an internal short-circuit cell based on the amount of capacity reduction of each of the battery cells.

The short-circuit cell detector may calculate the amount of capacity reduction of each of the battery cells by reflecting the consumption capacity of each of the battery cells calculated during the discharge period and the charge period of a first operating cycle in a difference between a capacity of each of the battery cells estimated during the idle period of the first operating cycle and a capacity of each of the battery cells during the idle period of a second operating cycle immediately before the first operating cycle.

The short-circuit cell detector may detect whether a first cell among the battery cells is the internal short-circuit cell by comparing an amount of capacity reduction of the first cell with amount of average capacity reduction of remaining cells excluding the first cell among the battery cells.

The short-circuit cell detector may determine a first cell as the internal short-circuit cell if a difference between the amount of capacity reduction of the first cell and the amount of average capacity reduction of the remaining cells excluding the first cell is greater than a predetermined threshold.

The battery cell monitoring apparatus may further include a switch controller that disconnects a battery module including the battery cells to an external device during the idle period and connects the battery module to an external device during the discharging period and the charging period.

BRIEF DESCRIPTION OF THE DRAWINGS

Features will become apparent to those of skill in the art by describing in detail exemplary embodiments with reference to the attached drawings in which:

FIG. 1 is a diagram showing a battery pack according to one or more embodiments.

FIG. 3 is a flow diagram showing a cell monitoring method according to one or more embodiments.

FIG. 7 is a diagram showing a cell monitoring apparatus according to one or more other embodiments.

DETAILED DESCRIPTION

Figure 2:
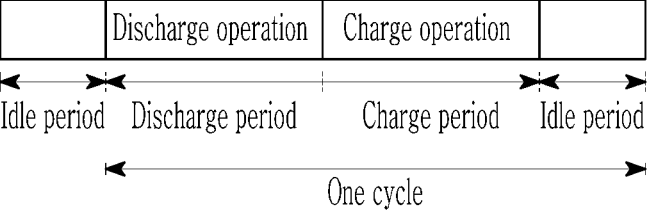
FIG. 2 is a diagram showing a method for operating a battery pack according to one or more embodiments.

Example embodiments will now be described more fully hereinafter with reference to the accompanying drawings. In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Example embodiments are provided so that this disclosure will be thorough and complete, and will fully convey exemplary implementations to those skilled in the art. The drawings and description are to be regarded as illustrative in nature and not restrictive. In the flowchart described with reference to the drawings in this specification, the order of operations may be changed, several operations may be merged, some operations may be divided, and specific operations may not be performed.

Throughout the specification and claims, if a part is referred to "include" a certain element, it may mean that it may further include other elements rather than exclude other elements, unless specifically indicated otherwise.

In addition, expressions described in the singular may be interpreted in the singular or plural unless explicit expressions such as "one" or "single" are used.

In addition, terms including an ordinal number, such as first, second, etc., may be used to describe various elements, but the elements are not limited by the terms. The above terms are used only for the purpose of distinguishing one element from another element. For example, without departing from the scope of the present disclosure, a first element may be referred to as a second element, and similarly, a second element may be referred to as a first element.

Furthermore, if a component is referred to be "connected" with another component, it includes not only the case where two components are "directly connected" but also the case where two components are "indirectly or non-contactedly connected" with another component interposed therebetween, or the case where two components are "electrically connected." On the other hand, if an element is referred to as "directly connected" to another element, it should be understood that no other element exists in the middle.

Figure 1:
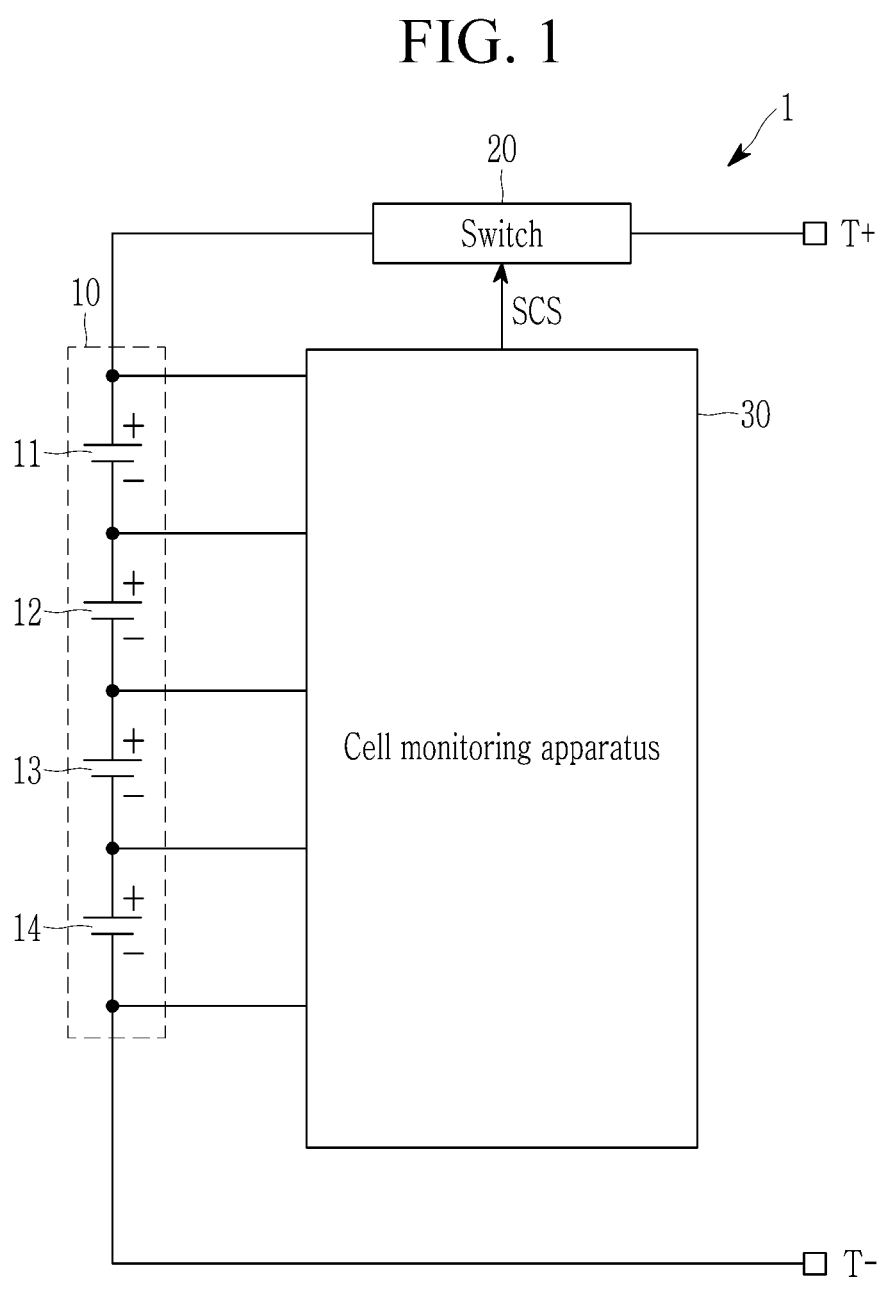

FIG. 1 is a diagram showing a battery pack according to one or more embodiments.

Referring to FIG. 1, the battery pack 1 may include at least one battery module 10, a switch 20, and a cell monitoring apparatus 30. The battery pack 1 may further include terminals T+ and T−.

The battery pack 1 may be connected to an external charging device or load through terminals T+ and T−, and may be charged by the charging device and discharged by the load.

The at least one battery module 10 may include cells, for example, battery cells 11, 12, 13, and 14, electrically connected to each other in series and/or parallel. In FIG. 1, only four cells 11, 12, 13, and 14 are shown for convenience of explanation. There could be fewer or more cells.

The switch 20 may control the current path during charging and discharging of the battery module 10. A closing and opening of the switch 20 may be controlled according to a switch control signal SCS transmitted from the cell monitoring apparatus 30.

The cell monitoring apparatus 30 may control and manage the overall operation of the battery pack 1. The cell monitoring apparatus 30 may monitor the overall status of the battery module 10 and the cells 11, 12, 13, and 14 included in the battery module 10, and may perform various control functions to adjust the status of the battery module 10 and the cells 11, 12, 13, and 14 included in the battery module 10. In an example embodiment, the cell monitoring apparatus 30 may control the charge/discharge current of the battery module 10 based on, in embodiments, the cell voltage of the battery cells 11, 12, 13, and 14, and battery current, and may perform a cell balancing operation on the cells 11, 12, 13, and 14.

The cell monitoring apparatus 30 may measure the voltages of battery cells 11, 12, 13, and 14 or receive the voltages of the battery cells 11, 12, 13, and 14. The cell monitoring apparatus 30 may measure battery current or may receive battery current measured by a current sensor.

The cell monitoring apparatus 30 may be, for example, a battery management system (BMS).

According to the embodiment, the cell monitoring apparatus 30 may monitor battery cells 11, 12, 13, and 14 and detect an internal short-circuit cell. The cell monitoring apparatus 30 may calculate the amount of capacity reduction of each cell 11, 12, 13, and 14, and may compare the amount of capacity reduction of each cell 11, 12, 13, and 14 with the amount of capacity reduction of the remaining cells excluding the corresponding cell, and may detect the internal short-circuit cell according to the comparison.

FIG. 2 is a diagram showing a method for operating a battery pack according to one or more embodiments.

Referring to FIG. 2, the battery pack 1 may be operated by setting the discharge period, charge period, and rest period as one operating cycle. The rest period may be a period for stabilizing the battery pack 1. The battery pack 1 may perform a discharging operation, a charging operation, and a rest operation depending on the discharge period, charge period, and rest period of the operating cycle.

In the discharging period, the cell monitoring apparatus 30 may set the switch 20 to the turn-on state to connect the battery module 10 to the load. The battery module 10 may be discharged depending on load usage.

In the charging period, the cell monitoring apparatus 30 may set the switch 20 to the turn-on state to connect the battery module 10 to the charging device. The battery module 10 may be charged by the charging device.

In the idle period, the cell monitoring apparatus 30 may set the switch 20 to a turn-off state and stabilize the voltage of the battery module 10. During the idle period, no current flows through the battery module 10.

The cell monitoring apparatus 30 may monitor the status of the cells 11, 12, 13, and 14 in the discharge period and the charge period, and may control the discharging and charging of the cells 11, 12, 13, and 14 according to the status of the cells 11, 12, 13, and 14. In one or more embodiments, the cell monitoring apparatus 30 may maintain the voltage of the cells 11, 12, 13, and 14 through cell balancing.

FIG. 3 is a flow diagram showing a cell monitoring method according to one or more embodiments.

Referring to FIG. 3, the battery pack 1 may perform a discharging operation, a charging operation, and a rest operation depending on the operating cycle.

The cell monitoring apparatus 30 may measure the open circuit voltage (OCV) of each cell 11, 12, 13, and 14 of the battery module 10 in the idle period (S310). The cell monitoring apparatus 30 may estimate the capacity of each cell 11, 12, 13, and 14 using the OCV of each cell 11, 12, 13, and 14, and may store the capacity of each cell 11, 12, 13, and 14 (S320).

The cell monitoring apparatus 30 may estimate the capacity of each cell 11, 12, 13, and 14 from the OCV of each cell 11, 12, 13, and 14 using an OCV table. The OCV table may be a table that stores capacity for each OCV. In the OCV table, OCV may be subdivided into set voltage units. The cell monitoring apparatus 30 may check the capacity corresponding to the OCV of each cell 11, 12, 13, and 14 in the OCV table. If the OCV of each cell 11, 12, 13, and 14 is not in the OCV table, the capacity of each cell 11, 12, 13, and 14 may be estimated using an interpolation method from two or more OCV values in the OCV table and the capacities corresponding to two or more OCV values.

According to an example embodiment, the cell monitoring apparatus 30 may reflect the current SOH (State of Health) of each cell 11, 12, 13, and 14 in the capacity of each cell 11, 12, 13, and 14 estimated using the OCV table, and may more accurately estimate the capacity of each cell 11, 12, 13, and 14.

The cell monitoring apparatus 30 may calculate the consumption capacity of each cell 11, 12, 13, and 14 based on the voltage of each cell 11, 12, 13, and 14 in the discharge period and the charge period, and may store the consumption capacity of each cell 11, 12, 13, and 14 (S330).

The cell monitoring apparatus 30 may calculate an amount of the capacity reduction of each cell 11, 12, 13, and 14 based on the capacity of each cell 11, 12, 13, and 14 (S340). The cell monitoring apparatus 30 may calculate the amount of capacity reduction of each cell 11, 12, 13, and 14 using the difference between the capacity of each cell 11, 12, 13, and 14 calculated in the idle period of the current cycle and the capacity of each cell 11, 12, 13, and 14 calculated in the idle period of the previous cycle (S340). In addition, the cell monitoring apparatus 30 may calculate an amount of capacity reduction of each cell 11, 12, 13, and 14 by reflecting the consumption capacity of each cell 11, 12, 13, and 14 in the difference between the capacity of each cell 11, 12, 13, and 14 calculated in the idle period of the current cycle and the capacity of each cell 11, 12, 13, and 14 calculated in the idle period of the previous cycle (S340).

The cell monitoring apparatus 30 may compare the amount of capacity reduction of each cell 11, 12, 13, and 14 with the amount of average capacity reduction of the remaining cells excluding the corresponding cell 11, 12, 13, and 14, and may determine whether each cell 11, 12, 13, and 14 is an internal short-circuit cell.

More specifically, the cell monitoring apparatus 30 may calculate the difference between the amount of capacity reduction of each cell 11, 12, 13, and 14 with the amount of average capacity reduction of the remaining cells excluding the corresponding cell 11, 12, 13, and 14 (S350), and may compare the calculated difference for each cell 11, 12, 13, and 14 with a predetermined threshold (S360).

If the calculated difference for a cell is greater than the predetermined threshold, the cell monitoring apparatus 30 may determine that the cell is an internal short-circuit cell (S370). In an example embodiment, if the difference for the cell is greater than the predetermined threshold, it may mean that the capacity of the cell has decreased more than the predetermined threshold.

If the calculated difference for a cell is less than the predetermined threshold, the cell monitoring apparatus 30 may determine that the cell is a normal cell (S380).

In an example embodiment, it may be assumed that the capacities of cells 11, 12, 13, and 14 calculated in the idle period of the previous cycle are 95 Ah, 100 Ah, 100 Ah, and 100 Ah, respectively, and the capacities of cells 11, 12, 13, and 14 calculated in the idle period of the current cycle are 93 Ah, 101 Ah, 101 Ah, and 100 Ah, respectively, and the capacities of cells 11, 12, 13, and 14 consumed by cell balancing in the discharge and charge periods of the current cycle are −3 Ah, 0 Ah, 0 Ah, and 0 Ah, respectively. Then, the amount of capacity reduction of cell 11 may be −4 Ah (=93 Ah-95 Ah-3 Ah), the amount of capacity reduction of cell 12 may be 1 Ah (=101 Ah-100 Ah-0 Ah), and the amount of capacity reduction of cell 13 may be 1 Ah (=101 Ah-100 Ah-0 Ah), and the amount of capacity reduction of the cell 14 may be 0 Ah (=100 Ah-100 Ah-0 Ah). In some embodiments, if the amount of capacity reduction has a negative value (−), it may mean that the capacity has decreased.

To determine whether the cell 11 is a short-circuit cell, the difference between the amount of capacity reduction of the cell 11 and the amount of average capacity reduction of the remaining cells 12, 13, and 14 may be calculated. Assume, in an embodiment, that the predetermined threshold compared to determine whether a cell is internal short-circuit cell may be set to −3 Ah. Since the amount of capacity reduction of cell 11 is −4 Ah, and the amount of average capacity reduction of the remaining cells 12, 13, and 14 is ⅔Ah, and the amount of capacity reduction of cell 11 has decreased to a value greater than −3 Ah than the average capacity reduction of the remaining cells 12, 13, and 14, so the cell 11 may be determined to be the internal short-circuit cell.

Figure 4:
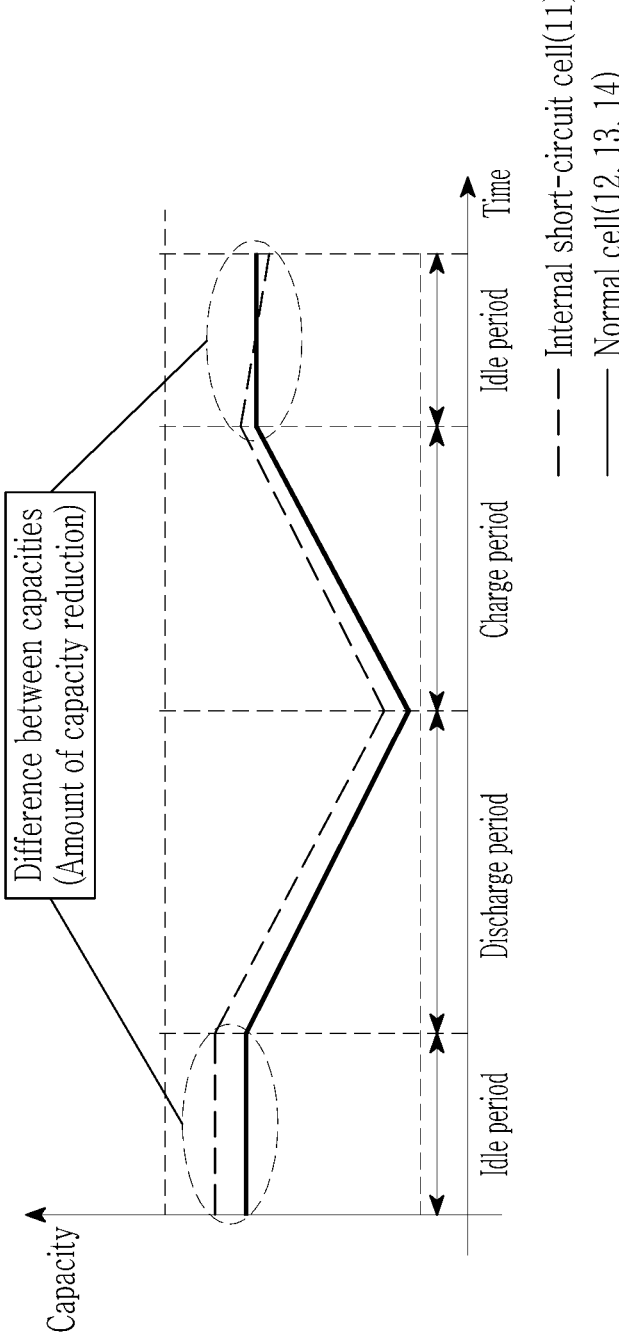
FIG. 4 is a graph showing the capacity of a normal cell and an internal short-circuit cell according to one or more embodiments.
Figure 5:
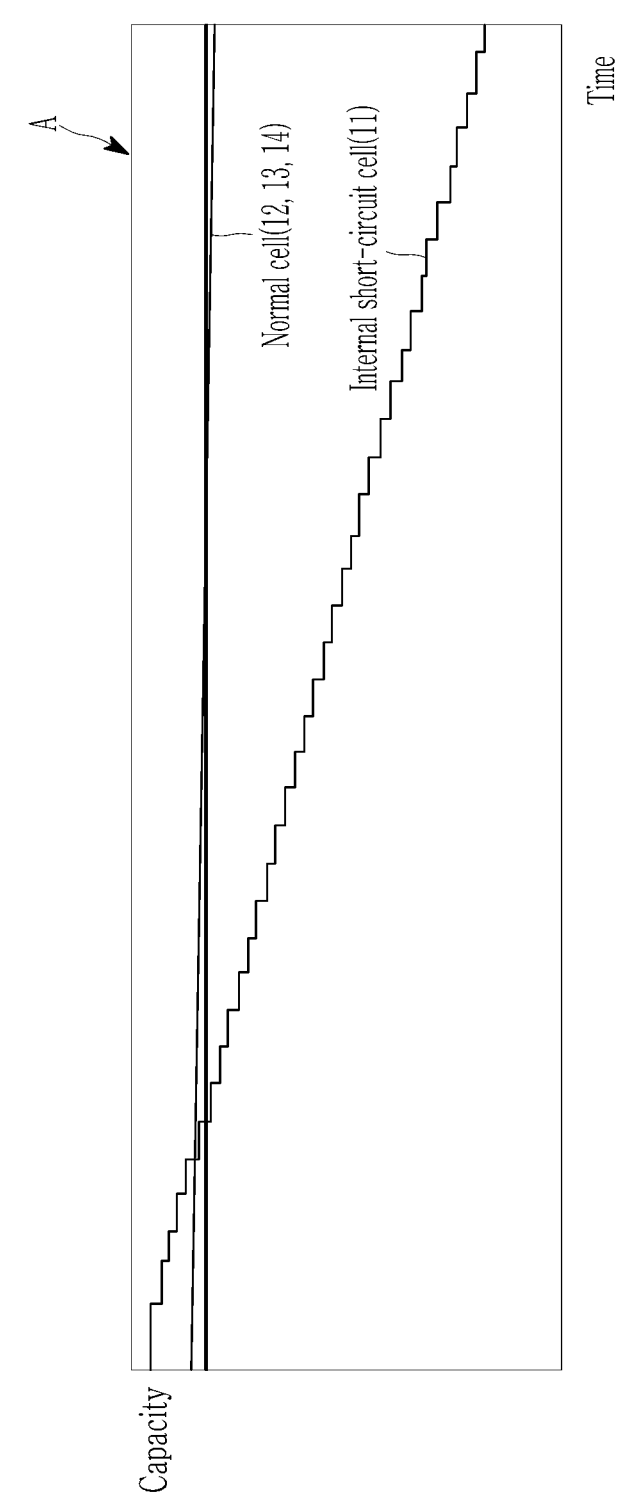
FIG. 5 is an enlarged view of portion A of the graph shown in FIG. 4 according to one or more embodiments.

FIG. 4 is a diagram showing the capacity of a normal cell and an internal short-circuit cell, and FIG. 5 is an enlarged view of portion A shown in FIG. 4.

Referring to FIG. 4 and FIG. 5, the capacity of the internal short-circuit cell 11 may be continuously decreased compared to the normal cells 12, 13, and 14. Therefore, it is possible to detect the internal short-circuit cell by estimating an amount of the capacity reduction of the cell.

In some embodiments, in order to estimate the amount of capacity reduction of the cell, the charge/discharge capacity of the cell must be accurately calculated, and accurate calculation of the charge/discharge capacity of the cell may be difficult due to various factors such as the accuracy of the current sensor, efficiency by temperature and charge/discharge rate, self-discharge amount of the cell, and current consumption according to cell balancing.

In other embodiments, the cell monitoring apparatus 30 may calculate an amount of the capacity reduction of the cell based on the difference between the capacity of the cell estimated by OCV in the previous idle period and the capacity of the cell estimated by OCV in the current idle period.

In this way, by estimating the capacity of the cell using the OCV measured in the idle period, since capacity calculation errors due to factors such as the accuracy of the current sensor, efficiency by temperature and charge/discharge rate, self-discharge amount of the cell, and current consumption according to cell balancing may be eliminated, accuracy in capacity estimation may be improved.

In one or more embodiments, another method for determining an internal short-circuit cell may be a method of comparing voltage between cells. In the method of comparing voltage between cells, the voltage-to-capacity value for each voltage section may be different, so the capacity standard corresponding to the threshold for each voltage section may be different, and as a result, the short-circuit resistance detected for each voltage section may vary. This means that the amount of capacity reduction may be varied depending on which voltage section the voltage is detected, that is, this may affect the detection accuracy of the internal short-circuit cell.

In other embodiments, the method of estimating the capacity of a cell using the OCV measured in the idle period does not require comparing voltages between cells, and thus may detect internal short-circuit cell more accurately than the method of comparing voltages between cells.

Figure 6:
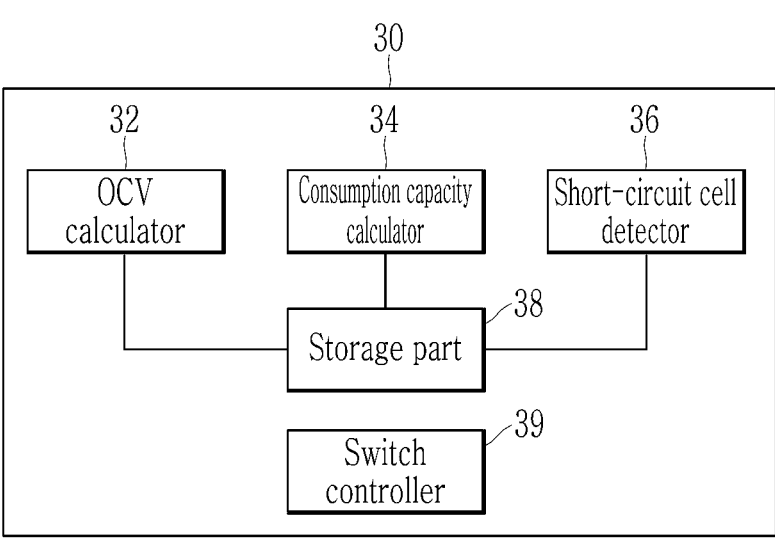
FIG. 6 is a diagram showing a cell monitoring apparatus according to one or more embodiments.

FIG. 6 is a diagram showing a cell monitoring apparatus according to an embodiment.

Referring to FIG. 6, the cell monitoring apparatus 30 may include an OCV calculator 32, a consumption capacity calculator 34, and a short-circuit cell detector 36. The cell monitoring apparatus 30 may further include a storage part 38. Additionally, the cell monitoring apparatus 30 may further include a switch controller 39.

The OCV calculator 32 may measure the OCV of each cell 11, 12, 13, and 14 in each idle period, and may estimate capacity of each cell 11, 12, 13, and 14 using the measured OCV of each cell 11, 12, 13, and 14. The capacity of each cell 11, 12, 13, and 14 measured during each idle period may be stored in the storage part 38.

The consumption capacity calculator 34 may calculate the consumption capacity of each cell 11, 12, 13, and 14 in the discharge period and the charge period. The consumption capacity of each cell 11, 12, 13, and 14 calculated in the discharge period and the charge period may be stored in the storage part 38.

The short-circuit cell detector 36 may calculate the difference between the capacities of each cell 11, 12, 13, and 14 calculated in two idle periods adjacent in time. The short-circuit cell detector 36 may calculate the difference between the capacity of each cell 11, 12, 13, and 14 calculated in the idle period of the t-th cycle and the capacity of each cell 11, 12, 13, and 14 calculated in the idle period of the (t−1)-th cycle. The short-circuit cell detector 36 may calculate an amount of capacity reduction of each cell 11, 12, 13, and 14 of the t-th cycle by reflecting the consumption capacity of each cell 11, 12, 13, and 14 calculated in the discharge period and charge period of the t-th cycle in the calculated difference of each cell 11, 12, 13, and 14. The short-circuit cell detector 36 may calculate the difference between the amount of capacity reduction of each cell 11, 12, 13, and 14 in the t-th cycle and the amount of average capacity reduction of the remaining cells excluding the corresponding cell, and may determine a cell whose calculated difference is greater than or equal to a predetermined threshold as an internal short-circuit cell.

The switch controller 39 may output a switch control signal SCS to the switch 20 to control the opening or closing of the switch 20 in the rest period, discharge period, and charge period. The switch controller 39 may output a switch control signal SCS that controls the opening of the switch 20 in the idle period. The switch controller 39 may output a switch control signal SCS that controls the closing of the switch 20 in the discharging period and the charging period.

Figure 7:
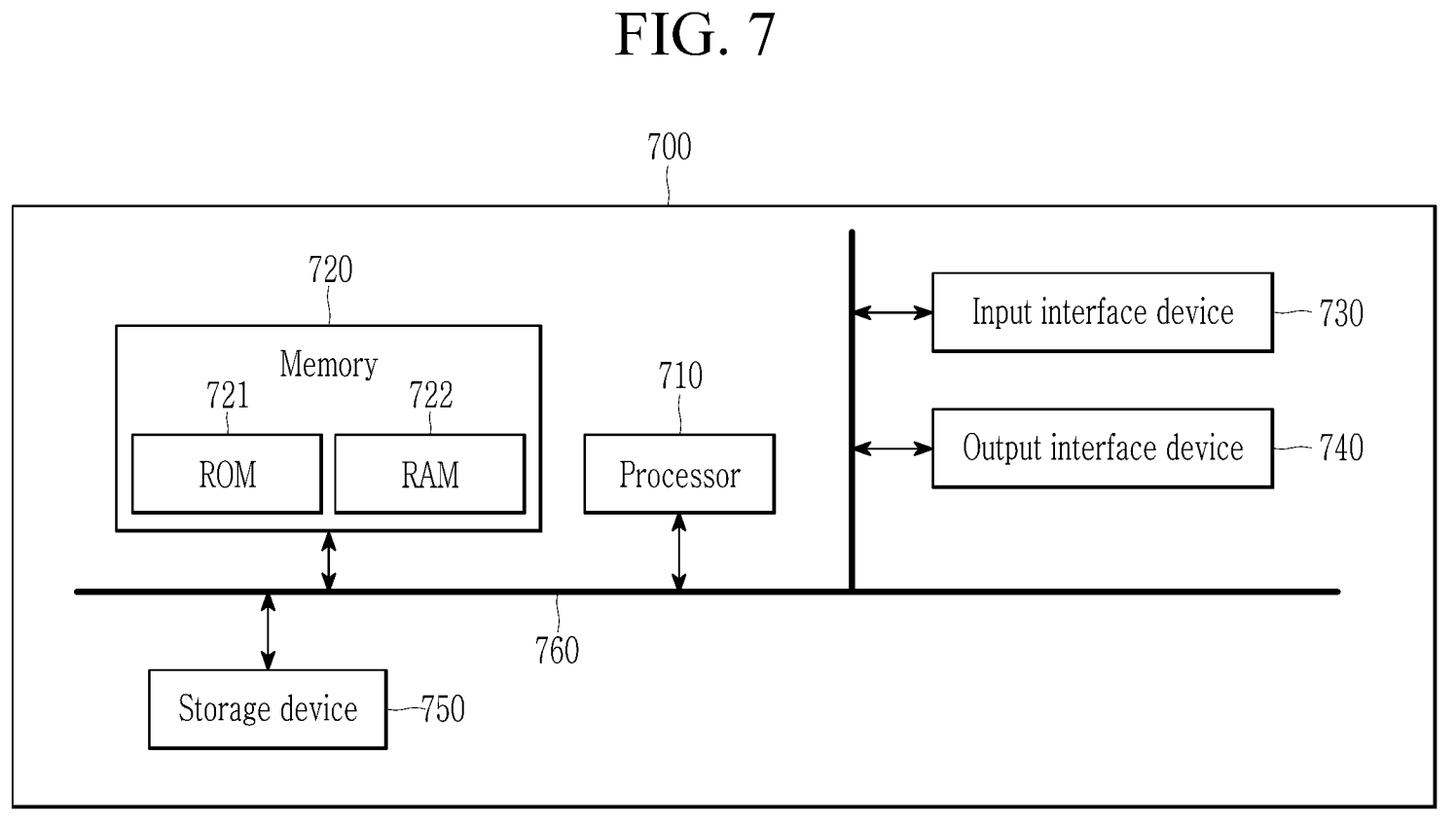

FIG. 7 is a diagram showing a cell monitoring apparatus according to one or more other embodiments.

Referring to FIG. 7, the cell monitoring apparatus 700 may represent a computing device that implements the cell monitoring method described above.

The cell monitoring apparatus 700 may include at least one of a processor 710, a memory 720, an input interface device 730, an output interface device 740, and a storage device 750. Each component may be connected by a bus 760 and may communicate with each other. In addition, each component may be connected through an individual interface or individual bus centered on the processor 710, rather than the common bus 760.

The processor 710 may be implemented as various types such as an application processor (AP), a central processing unit (CPU), a graphics processing unit (GPU), etc., and may be any semiconductor device that executes a command stored in the memory 720 or storage device 750. The processor 710 may execute program commands stored in at least one of the memory 720 and the storage device 750. The processor 710 may be configured to implement the functions and methods described above with respect to FIGS. 1 to 6.

The memory 720 and storage device 750 may include various types of volatile or non-volatile storage media. For example, the memory 720 may include read-only memory (ROM) 721 and random access memory (RAM) 722. In an embodiment, the memory 720 may be located inside or outside the processor 710, and the memory 720 may be connected to the processor 710 through various known means.

The input interface device 730 may be configured to provide data to the processor 710.

The output interface device 740 may be configured to output data from the processor 710.

In one or more embodiments, an internal short-circuit cell may be detected by calculating the capacity of the cell using the open circuit voltage calculated in the idle period.

Although various embodiments of the present invention have been described in detail above, the scope of the present disclosure is not limited thereto, and various modifications and improvements of those skilled in the art using the basic concepts of the present disclosure defined in the following claims are also included in the present disclosure.

What is claimed is:

1. A method for monitoring battery cells in a battery module in a cell monitoring apparatus, the method comprising:

measuring an open-circuit voltage (OCV) of each of the battery cells during a first idle period;

estimating a capacity of each of the battery cells using the OCV of each of the battery cells measured during the first idle period;

measuring an OCV of each of the battery cells during a second idle period following the first idle period;

estimating a capacity of each of the battery cells using the OCV of each of the battery cells measured during the second idle period; and detecting an internal short-circuit cell based on the capacity of each of the battery cells during the first idle period and the capacity of each of the battery cells during the second idle period, wherein the detecting an internal short-circuit cell comprises:

calculating an amount of capacity reduction of each of the battery cells based on a difference between the capacity of each of the battery cells during the first idle period and the capacity of each of the battery cells during the second idle period; and determining whether a first cell among the battery cells is the internal short-circuit cell by comparing amount of capacity reduction of the first cell with amount of average capacity reduction of remaining cells excluding the first cell among the battery cells, wherein during a discharging period, the cell monitoring apparatus sends a switch control signal to a switch to turn on the switch and connect the battery module to a load, wherein during a charging period, the cell monitoring apparatus sends a switch control signal to the switch to turn on the switch and connect the battery module to a charger, and wherein during an idle period, the cell monitoring apparatus sends a switch control signal to turn off the switch such that no current flows.

2. The method as claimed in claim 1, wherein determining whether the first cell is the internal short-circuit cell comprises determining the first cell as the internal short-circuit cell if a difference between the amount of capacity reduction of the first cell and the amount of average capacity reduction of the remaining cells excluding the first cell is greater than a predetermined threshold.

3. The method as claimed in claim 1, further comprising: calculating a consumption capacity of each of the battery cells in a discharge period and a charge period, wherein the calculating amount of capacity reduction of each of the battery cells comprises calculating an amount of capacity reduction of each of the battery cells by reflecting the consumption capacity of each of the battery cells calculated during the discharge period and the charge period in the difference between capacities of each of the battery cells estimated during the first idle period and the second idle period.

4. The method as claimed in claim 3, wherein measuring an OCV of each of the battery cells comprises blocking current supply to the battery module.

5. A battery cell monitoring apparatus that manages battery cells by setting a rest period, discharge period and charge period as one operation cycle, the battery cell monitoring apparatus comprising:

a processor configured to measure an open-circuit voltage (OCV) of each of the battery cells during an idle period of each operation cycle and estimates a capacity of each of the battery cells using the OCV of each of the battery cells;

wherein the processor is further configured to calculate a consumption capacity of each of the battery cells during the discharge period and the charge period of each operation cycle; and wherein the processor is further configured to calculate an amount of capacity reduction of each of the battery cells based on the capacity of each of the battery cells and a consumption capacity of each of the battery cells, and detects an internal short-circuit cell based on the amount of capacity reduction of each of the battery cells.

6. The battery cell monitoring apparatus as claimed in claim 5, wherein the processor is further configured to calculate the amount of capacity reduction of each of the battery cells by reflecting the consumption capacity of each of the battery cells calculated during the discharge period and the charge period of a first operating cycle in a difference between a capacity of each of the battery cells estimated in the idle period of the first operating cycle and a capacity of each of the battery cells in the idle period of a second operating cycle immediately before the first operating cycle.

7. The battery cell monitoring apparatus as claimed in claim 5, wherein the processor is further configured to detect whether a first cell among the battery cells is the internal short-circuit cell by comparing an amount of capacity reduction of the first cell with amount of average capacity reduction of remaining cells excluding the first cell among the battery cells.

8. The battery cell monitoring apparatus as claimed in claim 5, wherein the processor is further configured to determine a first cell as the internal short-circuit cell if a difference between the amount of capacity reduction of the first cell and the amount of average capacity reduction of the remaining cells excluding the first cell is greater than a predetermined threshold.

9. The battery cell monitoring apparatus as claimed in claim 5, further comprising:

a switch controller that disconnects a battery module including the battery cells to an external device during the idle period and connects the battery module to an external device during the discharging period and the charging period.

* * * * *